(12) United States Patent
Takeishi et al.

(10) Patent No.: US 8,084,194 B2
(45) Date of Patent: Dec. 27, 2011

(54) SUBSTRATE EDGE TREATMENT FOR COATER/DEVELOPER

(75) Inventors: Tomoyuki Takeishi, Yokkaichi (JP); Yuji Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1221 days.

(21) Appl. No.: 11/675,869

(22) Filed: Feb. 16, 2007

(65) Prior Publication Data

US 2007/0196566 A1 Aug. 23, 2007

(30) Foreign Application Priority Data

Feb. 16, 2006 (JP) .................. 2006-039361

(51) Int. Cl.
*B05C 11/10* (2006.01)
*B08B 1/04* (2006.01)
*B08B 3/04* (2006.01)

(52) U.S. Cl. ............ 430/330; 430/30; 427/145; 118/52; 118/66; 134/1.3; 134/152; 134/32

(58) Field of Classification Search .................. None
See application file for complete search history.

(56) References Cited

U.S. PATENT DOCUMENTS

| | | | | |
|---|---|---|---|---|
| 6,059,891 | A * | 5/2000 | Kubota et al. .................. | 134/18 |
| 6,822,734 | B1 * | 11/2004 | Eidelman et al. .......... | 356/237.2 |
| 2006/0162646 | A1 * | 7/2006 | Akimoto et al. ................ | 118/52 |

FOREIGN PATENT DOCUMENTS

| | | |
|---|---|---|
| JP | 58-58731 | 4/1983 |
| JP | 2-125420 | 5/1990 |
| JP | 5-82478 | 4/1993 |
| JP | 6-124887 | 5/1994 |
| JP | 7-142332 | 6/1995 |
| JP | 8-139007 | 5/1996 |
| JP | 8-264418 | 10/1996 |
| JP | 8-279494 | 10/1996 |
| JP | 10-303114 | 11/1998 |
| JP | 11-40530 | 2/1999 |
| JP | 2001-118824 | 4/2001 |
| JP | 2002-50668 | 2/2002 |
| JP | 2002-124501 | 4/2002 |
| JP | 2002-299305 | 10/2002 |
| JP | 2003-289034 | 10/2003 |
| JP | 2003-289035 | 10/2003 |
| JP | 2004-518293 | 6/2004 |
| JP | 2004-335542 | 11/2004 |

OTHER PUBLICATIONS

Japanese Office Action issued Feb. 15, 2011, in Patent Application No. 2006-039361 (with English-language translation).
Office Action issued Jul. 5, 2011, in Japanese Patent Application No. 2006-039361 (with English-language Translation).

* cited by examiner

*Primary Examiner* — Daborah Chacko Davis

(74) *Attorney, Agent, or Firm* — Oblon, Spivak, McClelland, Maier & Neustadt, L.L.P.

(57) ABSTRACT

A method of substrate edge treatment includes forming a processing target film on a treatment target substrate, applying an energy line to a predetermined position on the processing target film to form a latent image on the processing target film, heating the treatment target substrate in which the latent image is formed on the processing target film, developing the processing target film after the heating, inspecting whether a residue is present at an edge of the treatment target substrate after the developing, and cleaning an end of the treatment target substrate to remove the residue at the edge of the treatment target substrate determined to be defective in the inspecting.

2 Claims, 4 Drawing Sheets

SUBSTRATE EDGE TREATMENT FOR COATER/DEVELOPER

CROSS-REFERENCE TO RELATED APPLICATIONS

This application is based upon and claims the benefit of priority from prior Japanese Patent Application No. 2006-039361, filed Feb. 16, 2006, the entire contents of which are incorporated herein by reference.

BACKGROUND OF THE INVENTION

1. Field of the Invention

The present invention relates to a substrate edge treatment, and more particularly to a substrate edge treatment having a step of removing surface roughness of a substrate or a film that has adhered to the substrate.

2. Description of the Related Art

In a manufacturing process of a semiconductor device, an unnecessary part of a metal thin film formed at an end of a semiconductor wafer may be removed by etching in some cases. Various proposals have been conventionally made to suppress unintentional etching at the center of a wafer surface involved by scattering of an etchant in this process (see, e.g., Jpn. Pat. Appln. KOKAI Publication No. 2001-118824 or Jpn. Pat. Appln. KOKAI Publication No. 2002-299305).

Further, removal of a metal at a wafer end has been also a problem in a liquid immersion exposure tool that has recently come into practical use. The liquid immersion exposure tool corresponds to a technique that fills a space between a resist film surface and a lens of an exposure tool with a liquid to perform exposure when effecting exposure with respect to the resist film formed on a treatment target substrate. As a tool used for such an exposure technique, there is one disclosed in, e.g., Jpn. Pat. Appln. KOKAI Publication No. 303114-1998.

On the other hand, in liquid immersion exposure, an accuracy of a resist pattern cannot be possibly obtained because of, e.g., elution of a photosensitive agent or the like contained in a resist film into water, or penetration of water into the resist film. In order to avoid such problems, a water-repellent protection film is formed on the resist film. As the protection film, there are a developer soluble type protection film that can be solved in a developer and a solvent soluble type protection film that can be solved with a dedicated solvent. The protection film is removed after end of a series of coating/developing treatments.

In particular, in case of using the developer soluble type protection film, when a developer is supplied to an upper side of a water-repellent protection film in a developing treatment after liquid immersion exposure, since the developer is repelled on a surface of the protection film from a substrate edge, the protection film cannot be sufficiently solved at the substrate edge and it may possibly remains as a residue even after end of the developing treatment. When etching step or the like is carried out in this state, the protection film remaining at the substrate edge serves as a mask, and sharp-pointed protrusions are generated at the substrate edge. These protrusions become particles to disadvantageously contaminate a carriage portion and others in an etching device.

As explained above, in a state where the sharp-pointed protrusions remain at the substrate edge or a bevel of this part, when a resist film is coated/exposed/developed at a subsequent lithography step to form a resist pattern, an organic film enters a groove between the protrusions, and this film may not be possibly removed even after end of development. Further, when an etching step or the like is carried out in this state, the organic film remaining at the substrate edge become particles to disadvantageously contaminate a carriage portion or the like in an etching device.

Therefore, realization of a substrate treatment that can remove a resist pattern even after end of development and avoid occurrence of particles even in a state where sharp-pointed protrusions remain at a substrate edge or a substrate bevel has been demanded.

BRIEF SUMMARY OF THE INVENTION

According to the first aspect of the invention, there is provided a method of substrate edge treatment, which includes:

forming a processing target film on a treatment target substrate;

applying an energy line to a predetermined position on the processing target film to form a latent image on the processing target film;

heating the treatment target substrate in which the latent image is formed on the processing target film;

developing the processing target film after the heating;

inspecting whether a residue is present at an edge of the treatment target substrate after the developing; and cleaning an end of the treatment target substrate to remove the residue at the edge of the treatment target substrate determined to be defective in the inspecting.

According to a second aspect of the invention, there is provided a method of substrate edge treatment, which includes:

forming a processing target film on a treatment target substrate;

inspecting whether the processing target film is adhered to a rear surface at an edge of the treatment target substrate after the forming a processing target film;

cleaning an end of the treatment target substrate to remove a residue at the edge of the treatment target substrate determined to be defective in the inspecting;

applying an energy line to a predetermined position on the processing target film with respect to the treatment target substrate determined to be defective in the inspecting or with respect to the treatment target substrate determined to be defective in the inspecting and cleaned at the end thereof, thereby forming a latent image on the processing target film;

heating the treatment target substrate in which the latent image is formed on the processing target film; and developing the processing target film after the heating.

DETAILED DESCRIPTION OF THE INVENTION

In embodiments explained below, whether a substrate edge is cleaned or whether the control advances to the next step without cleaning the substrate edge is controlled depending on presence of a residue of a processing target film at the substrate edge. Carrying out the cleaning treatment in this manner can eliminate particles produced due to a residue at the substrate edge and can improve a yield ratio of a semiconductor device.

Embodiments according to the present invention will now be explained hereinafter with reference to the accompanying drawings.

First Embodiment

Figure 1:
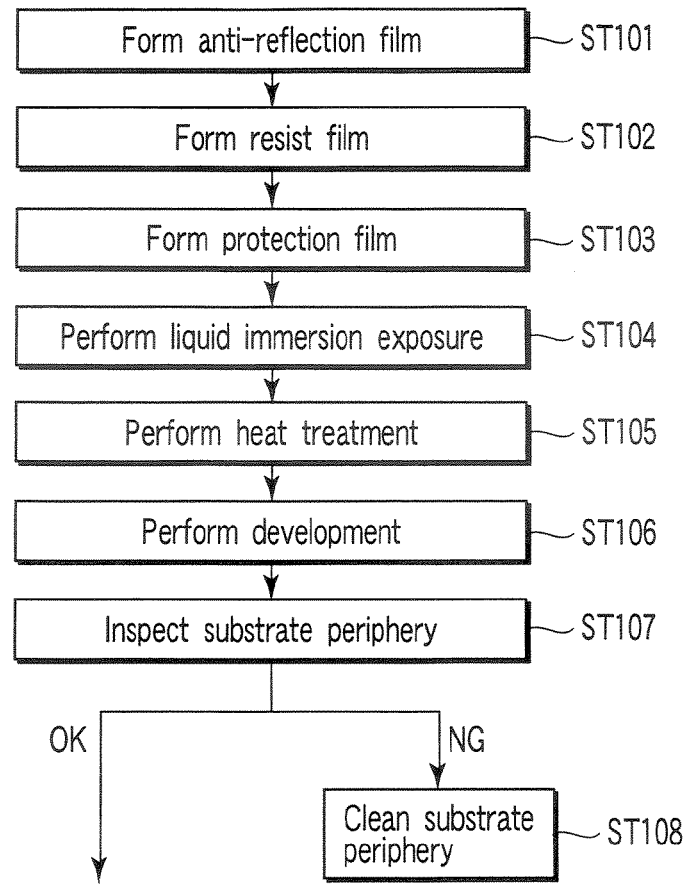
FIG. 1 is a flowchart showing a manufacturing process of a semiconductor device according to a first embodiment.

As shown in a process flowchart of FIG. 1, an anti-reflection film coating material (e.g., ARC29A manufactured by NISSAN CHEMICAL INDUSTRIES, LTD.) is dropped and rotated to spread on a semiconductor substrate, and then a heat treatment is carried out to form an anti-reflection film having a film thickness of 80 nm (ST101). An ArF chemically amplified resist film containing an acid producing agent is formed with a film thickness of 170 nm on the anti-reflection film (ST102). Further, a developer soluble type protection film (e.g., TILC019 manufactured by TOKYO OHKA KOGYO CO., LTD.) is formed with a film thickness of 140 nm on the ArF chemically amplified resist film (ST103).

In more detail, the anti-reflection film, the chemically amplified resist, and the developer soluble type protection film are formed in accordance with a procedure of spreading each material on a treatment target substrate by a spin coat method and effecting a heat treatment to remove a solvent contained in a coating material.

Figure 2:
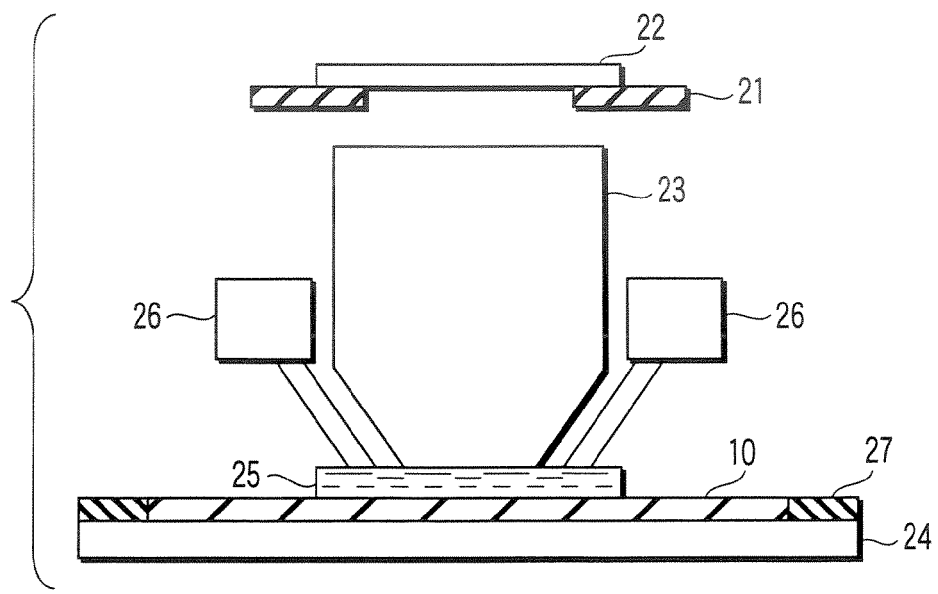
FIG. 2 is a view showing a schematic structure of a liquid immersion exposure tool that is used and explained in the first embodiment.

Then, the treatment target substrate is carried to a liquid immersion exposure tool. The liquid immersion exposure tool is used to transfer a semiconductor element pattern formed on a reticle onto the resist film, thereby forming a latent image (ST104). FIG. 2 schematically shows the liquid immersion exposure tool used in this embodiment. That is, in FIG. 2, a reticle stage 21 is arranged below a non-illustrated illumination optics, and a reticle 22 is disposed on this reticle stage 21. The reticle stage 21 can move in parallel. A projection lens system 23 is arranged below the reticle stage 21, and a wafer stage 24 is arranged below this projection lens system 23. A semiconductor substrate 10 subjected to above-described treatment is provided on the wafer stage 24. The wafer stage 24 moves in parallel together with the semiconductor substrate 10. A support plate 27 is provided around the semiconductor substrate 10.

A fence 25 is disposed below the projection lens system 23. A pair of water supply/drainage units 26 that supply water into the fence 25 and drain wafer from the fence 25 are provided beside the projection lens system 23. At the time of exposure, a space between the substrate 10 and the projection lens system 23 in a region surrounded by the fence 25 and the projection lens 23 is filled with a liquid film of water. Exposure light exiting from the projection lens system 23 is transmitted through a water layer to reach an irradiation region. An image of a mask pattern (not shown) on the reticle 22 is projected onto the chemically amplified resist corresponding to the irradiation region, thereby forming a latent image.

Figure 3A:
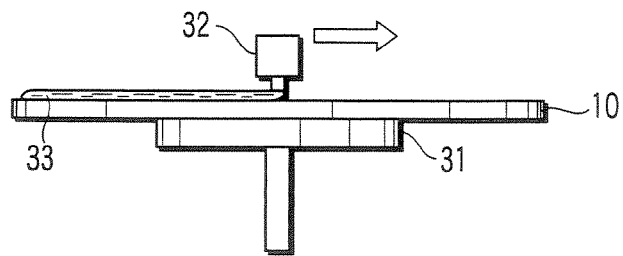
FIG. 3A is a schematic cross-sectional view for explaining a developer supply method in the first embodiment.
Figure 3B:
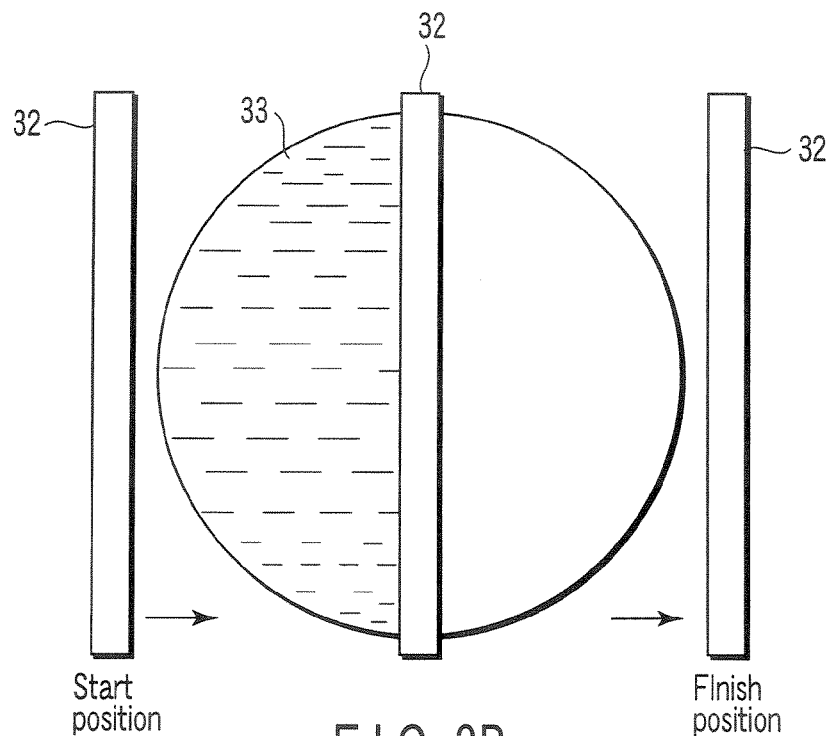
FIG. 3B is a schematic cross-sectional view for explaining the developer supply method in the first embodiment.

The substrate 10 having the latent image formed thereon by the above-described process is carried into a heating chamber (not shown), and subjected to a heat treatment under conditions of 130° C. and 60 seconds (ST105). Subsequently, the treatment target substrate 10 is carried to a developing treatment unit (ST106). In this developing treatment unit, when the treatment target substrate 10 is carried to a position directly above a scattered developer saucer cup (not shown), a pin first moves up to receive the substrate 10, and then the substrate 10 is mounted on a spin chuck 31 to be subjected to vacuation as shown in FIG. 3. Further, a straight tubular nozzle 32 retracted in a nozzle standby portion discharges a developer 33 while scanning from one end toward the other end of the substrate 10, whereby the developer 33 is put on an alkali soluble type protection film (not shown) formed on an uppermost surface of the treatment target substrate 10 to effect development. When the developer 33 is supplied, the developer soluble type protection film is dissolved, and then the resist film (not shown) having the latent image formed thereon is developed. After performing static development for 30 seconds, pure water is supplied to the treatment target substrate 10 to wash off the developer. Furthermore, the treatment target substrate 10 is rotated by the spin chuck 31 to be subjected to spin drying.

Figure 4:
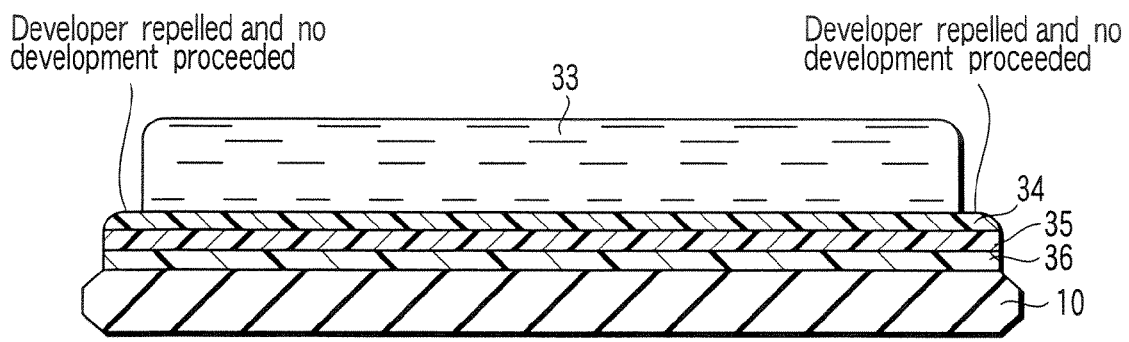
FIG. 4 is a schematic cross-sectional view when the developer is put on a developer soluble type protection film.
Figure 5:
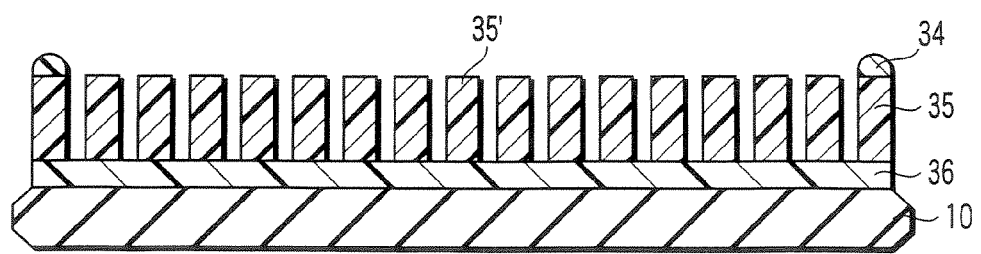
FIG. 5 is a schematic cross-sectional view showing a resist pattern after a developing treatment.

However, as shown in FIG. 4, when the developer 33 is supplied to the highly water-repellent developer soluble type protection film 34, the developer 33 is repelled at a given position at the edge of the substrate 10. As a result, the developer soluble type protection film 34 cannot be dissolved, and the resist film 35 formed on a lower layer of the protection film 34 is not developed. As a result, as shown in FIG. 5, although a resist pattern 35' is formed at the center of the substrate 10, the protection film 34 and the resist film 35 may possibly remain as residues at the edge of the substrate 10.

Figure 6:
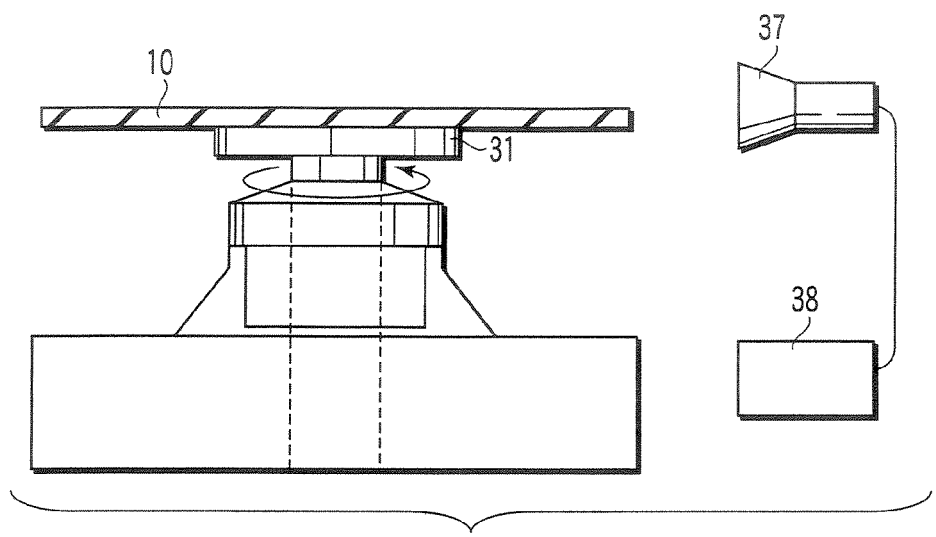
FIG. 6 is a side view showing a schematic structure of a substrate edge observation/judgment mechanism described in the first embodiment.

Thus, as shown in FIG. 6, the edge of the substrate 10 is then observed by using a camera 37 disposed in the developing treatment unit while rotating the treatment target substrate 10. Moreover, when the rotating substrate 10 returns to an observation start point, rotation of the substrate 10 is stopped, and observation of the edge of the substrate 10 is also terminated. Data obtained from observation by the camera 37 as substrate edge observing means is transferred to a substrate edge judgment mechanism 38 as needed. The substrate edge judgment mechanism 38 judges whether a residue of the alkali soluble type protection film 34 is present at the rim of the substrate 10 is judged from the data obtained from observation. If the residue of the developer soluble type protection film 34 is confirmed at the edge of the substrate 10, an instruction can be issued to carry out a treatment of cleaning the edge of the substrate 10. Additionally, when the residue is not present at the edge of the substrate 10 at all, an instruction can be issued to avoid the treatment of cleaning the edge, and an instruction can be issued to carry the treatment target substrate 10 from a coater/developer (ST107).

Figure 7:
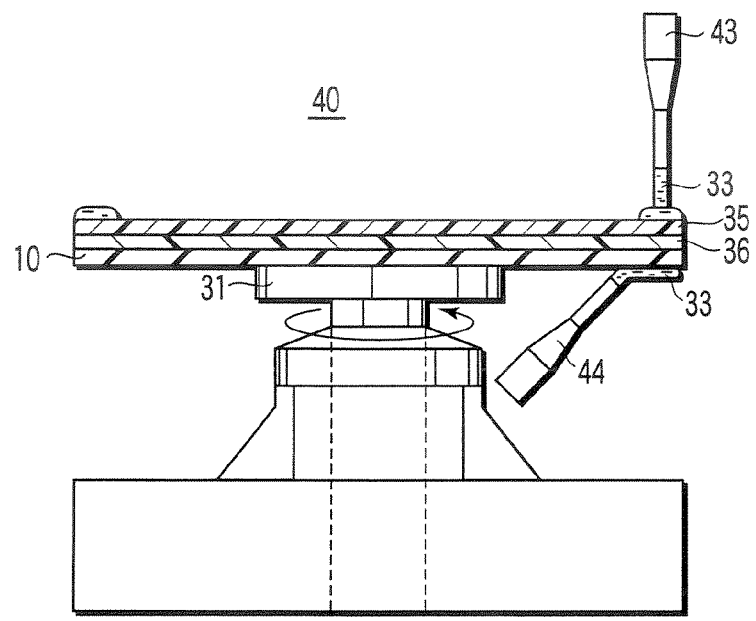
FIG. 7 is a schematic side view showing a substrate edge cleaning treatment described in the first embodiment.

If the residue is present at the edge of the treatment target substrate 10 as a result of observation, a substrate edge cleaning treatment is effected (ST108). As shown in FIG. 7, a substrate edge cleaning nozzle 43 and a substrate rear surface cleaning nozzle 44 are moved to predetermined positions near the substrate edge. Further, the developer 33 is discharged toward the edge of the substrate 10 while rotating the treatment target substrate 10. When the developer 33 is also discharged from the rear surface cleaning nozzle 44, the developer 33 discharged from the substrate edge cleaning nozzle 43 can be prevented from flowing toward the rear surface of the treatment target substrate 10, thereby avoiding contamination of the spin chuck 31 holding the substrate 10. Furthermore, the developer 33 is discharged from the substrate edge cleaning nozzle 43 in a direction parallel to a rotating direction of the substrate 10. Moreover, a cleaning liquid (the developer 33) is discharged toward the outside of the substrate 10 apart from a tangential line at a supply position on a circular orbit described on the substrate 10 by the supply position. As a result, the developer 33 supplied to the edge of the substrate 10 can be prevented from flowing toward the center of the substrate 10, and the cleaning liquid can be uniformly supplied to the developer soluble protection film 34 at the edge of the substrate 10, thereby removing the protection film 34 included in this region.

Then, after supplying the developer 33 at the edge, pure water is supplied to the upper surface and the rear surface of the substrate 10 to wash off the developer 33, and the substrate 10 is rotated to be subjected to spin drying, thus terminating a series of developing treatments.

When the developer soluble protection film 34 remaining at the edge of the substrate 10 is removed in the development unit in this manner, particles caused due to the substrate edge can be reduced at a lithography step and subsequent steps, and contamination of the coater/developer as well as the etching device can be suppressed.

Although a substrate edge cleaning device 40 supplies the cleaning liquid toward the end of the substrate 10 from the substrate edge cleaning nozzle 44 to perform cleaning in this embodiment, the cleaning treatment for the edge of the substrate 10 is not restricted thereto. In a substrate edge cleaning treatment device 50 shown in FIG. 8, when the substrate is carried to a position directly above a cup (not shown), a pin (not shown) first moves up to receive the substrate 10, and then the substrate 10 is mounted on a spin chuck 31 to be subjected to vacuation.

Subsequently, an elevation driving unit 55 moves down a cleaning liquid holding top plate 51 to be brought into contact with an upper portion of a cleaning liquid holding bottom plate 53. In this state, the cleaning liquid holding top plate 51 and the cleaning liquid holding bottom plate 53 form a ring-shaped concave portion surrounding an end of the substrate 10. The concave portion is arranged to cover the entire edge of the substrate, and rotates the substrate 10 in this state.

Then, a developer 33 is discharged from a periphery cleaning nozzle 43 toward the concave portion. Additionally, when the concave portion is filled with a fixed amount or more of the cleaning liquid 33, the edge of the substrate 10 is immersed in the cleaning liquid 33, thus performing a cleaning treatment.

After effecting the cleaning treatment for a predetermined time, the developer 33 is drained from a drainage opening 54. Then, when the holding top plate 51 is moved up, the concave portion is divided into the cleaning liquid holding top plate 51 and the cleaning liquid holding bottom plate 53, and a small amount of the developer 33 remaining at the edge of the substrate 10 is laterally discharged by centrifugal force, thereby terminating the cleaning treatment.

Such an embodiment can prevent the cleaning liquid 3 supplied to the edge of the substrate 10 from flowing toward the center of the substrate 10 and can uniformly supply the developer 33 to a region where the developer soluble type protection film 34 that has entered a damaged part of the edge of the substrate 10 should be removed, whereby an organic film included in this region can be removed.

Further, although the single substrate edge cleaning treatment device simultaneously removes the organic film that has entered a damaged part on the rear surface side of the substrate 10 and the organic film that has entered damaged parts at the edge on the front surface side and the end side of the substrate 10 in this embodiment, the present invention is not restricted to this embodiment. After cleaning either the edge on the front surface side and the end side or the rear surface side of the substrate 10 first, the other may be cleaned. Furthermore, the treatment device may be changed depending on cleaning at the edge on the front surface side and the end side and cleaning on the rear surface side of the substrate 10, and any device may be used as long as an effect equivalent to that described in conjunction with this embodiment can be obtained.

Second Embodiment

A second embodiment uses the cleaning treatment system and the cleaning treatment described in conjunction with the first embodiment to remove a resist film that has entered a space between protrusions formed at a substrate edge by a reactive ion etching (RIE) device at the time of resist coating.

For example, when forming a trench capacitor, a silicon nitride film and a silicon oxide film are sequentially formed on a silicon substrate surface by a hot wall type CVD device or the like. Then, coating/exposure/development of a resist film is performed on the silicon oxide film to form a resist pattern. However, the resist film may remain at a position where the resist film does not essentially remain at a substrate edge in some cases. In this state, the resist pattern is used as a mask to sequentially etch the silicon oxide film, the silicon nitride film, and the silicon substrate, thereby forming a trench serving as a capacitor. At this time, the resist film remaining at the substrate edge becomes a mask, and sharp-pointed protrusions are generated at the substrate edge. Such sharp-pointed protrusions are produced when a plasma does not sufficiently reach a wafer edge, RIE etching of the silicon oxide film or the silicon nitride film is insufficient, and the remaining silicon oxide film and silicon nitride film become masks.

When the sharp-pointed protrusions are produced at the substrate edge in this manner, the resist film enters a groove between the sharp-pointed protrusions and cannot be removed at the time of coating and forming the resist film at the next lithography step. When the substrate is carried in this state, the resist film that has entered the space between the protrusions at the substrate edge become particles to contaminate a carriage portion in a coater/developer. Moreover, when an etching process or the like is performed in this state, the resist film at the substrate edge disadvantageously contaminates a carriage portion or the like in an etching device.

Figure 9:
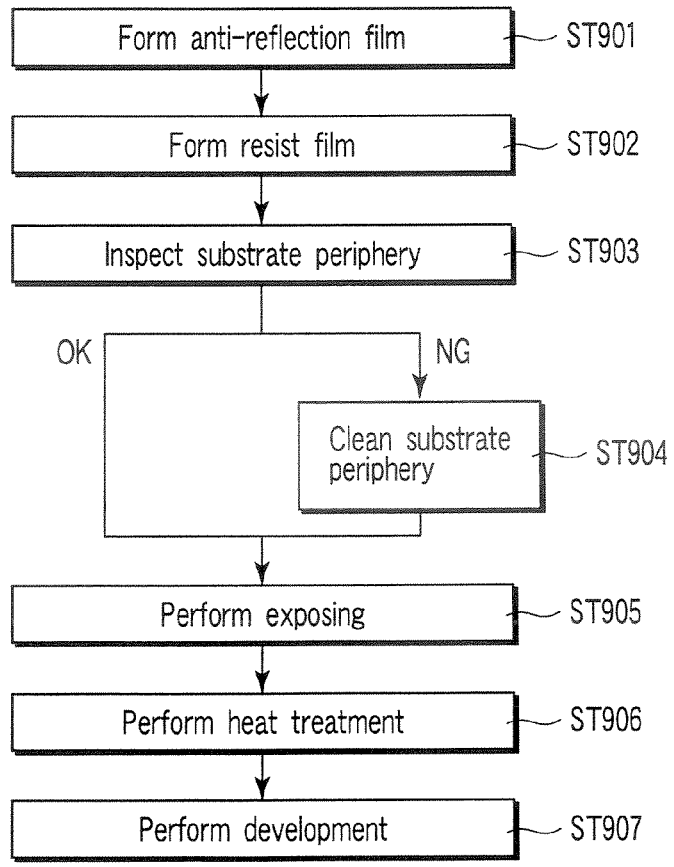
FIG. 9 is a flowchart showing a manufacturing process of a semiconductor element according to a second embodiment.

A process according to the second embodiment will now be described in detail with reference to FIG. 9. Like the first embodiment, an anti-reflection film having a film thickness of 80 nm is formed on the semiconductor substrate (ST901). An ArF chemically amplified resist film containing an acid producing agent is formed with a film thickness of 170 nm on the anti-reflection film (ST901). Although not shown, the chemically amplified resist film is formed in accordance with the following known procedure.

First, the treatment target substrate is supplied to a spin chuck to be held at a predetermined position. Subsequently, a predetermined amount of a coating liquid is dispensed from a coating liquid dispensing nozzle to the treatment target substrate held by the spin chuck, and this coating liquid is spread on the treatment substrate to form a coating film (see FIG. 3). Then, the treatment target substrate 10 is rotated for a predetermined time and adjusted to have a desired film thickness.

Subsequently, like FIG. 7, a cleaning liquid, e.g., cyclohxanone is supplied from a rear surface cleaning nozzle 44 to the rear surface of the treatment target substrate 10. Supply of this cleaning liquid washes off the chemically amplified resist liquid that has adhered to the rear surface of the treatment target substrate 10. It is to be noted that, at this time, a thinner as a cleaning liquid that performs fine cleaning is belched out to the substrate edge to carry out an edge cut treatment of cutting the resist film at the substrate edge. Thereafter, supply of the thinner is stopped, and the thinner that has adhered to the rear surface of the treatment target substrate 10 is spun off, whereby the treatment target substrate 10 wet with the thinner is dried. However, the resist film that has entered the space between the protrusions produced at the substrate edge at the etching step cannot be completely removed even if cleaning is performed with the thinner.

Therefore, after end of the series of coating processes, like FIG. 6 according to the first embodiment, the substrate edge is observed by using a camera 37 disposed in a resist coating treatment unit while rotating the treatment target substrate 10 (ST903). Moreover, when the rotating substrate 10 returns to an observation start point, rotation of the substrate 10 is stopped, and observation of the substrate edge is also terminated. Data obtained from observation by the camera 37 as substrate edge observing means is transferred to a substrate edge judgment mechanism 38 as needed.

The substrate edge judgment mechanism 38 judges whether a residue of the resist film that has entered the space between the protrusions is present at the substrate edge from the data obtained from observation (ST904). If the residue of the resist film is confirmed, an instruction can be issued to carry out a treatment of cleaning off the residue. Additionally, if the residue is not present at all, an instruction can be issued to prevent the edge cleaning treatment from being effected, and an instruction to carry the treatment target substrate from the coater/developer can be issued.

Figure 8:
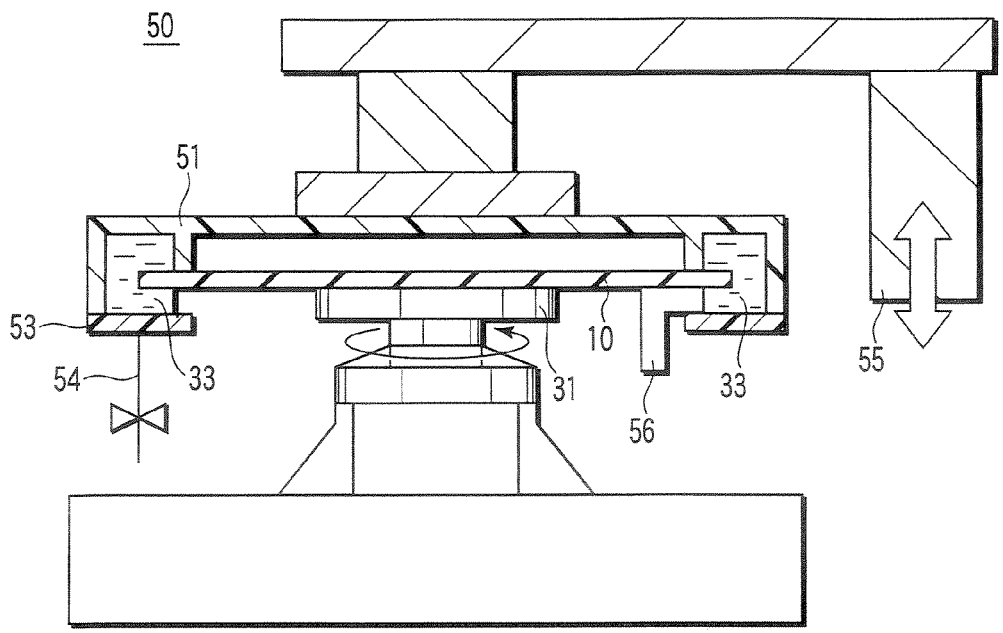
FIG. 8 is a schematic cross-sectional view showing the substrate edge cleaning treatment described in the first embodiment.

Then, the substrate edge cleaning treatment is carried out. As a substrate edge cleaning method, such a conformation as shown in FIG. 8 is desirable. In a substrate edge cleaning treatment device 50, when the substrate 10 is carried to a position directly above a cup, a pin first moves up to receive the substrate, and then the substrate 10 is mounted on the spin chuck 31 to be subjected to vacuation. Subsequently, an elevation driving unit 55 moves down a cleaning liquid holding top plate 51 to be brought into contact with an upper portion of a cleaning liquid holding bottom plate 53. In this state, the cleaning liquid holding top plate 51 and the cleaning liquid holding bottom plate 53 form a ring-shaped concave portion to surround the substrate end. Further, the concave portion is arranged to cover the entire edge of the substrate 10, and the substrate 10 is rotated in this state.

Then, the cleaning liquid 33 is discharged from a discharge opening 53 toward the concave portion. Furthermore, when the concave portion is filled with a fixed amount or more of the cleaning liquid 33, the edge of the substrate 10 is immersed in the cleaning liquid 33, thus effecting the cleaning treatment.

After performing the cleaning treatment for a predetermined time, the developer 33 is drained from a drainage opening 54. Subsequently, when the cleaning liquid holding top plate 51 is moved up, the concave portion is divided into the cleaning liquid holding top plate 51 and the cleaning liquid holding bottom plate 53, and a small amount of the cleaning liquid 33 remaining at the edge of the substrate 10 is laterally discharged by centrifugal force, thereby terminating the cleaning treatment.

Such an embodiment can prevent the cleaning liquid supplied to the substrate edge from flowing toward the center of the substrate and can uniformly supply the cleaning liquid to a region where the chemically amplified resist film that has entered a damaged part at the substrate edge should be removed, thus removing the chemically amplified resist film included in this region.

A semiconductor element pattern is transferred onto the resist film of the substrate 10 by a scan exposure tool to form a latent image. Thereafter, a heat treatment and a developing treatment are performed (ST905 to ST907).

When the coating/developing treatment is performed in this manner, the coater/developer or a carriage portion or the like in an etching device used at the next step can be prevented from being contaminated.

Moreover, although the single substrate edge cleaning treatment device simultaneously removes the organic film that has entered a damaged part on the rear surface side of the substrate and the organic film that has entered damaged parts at the edge on the substrate front surface side and the end side in this embodiment, the present invention is not restricted to this embodiment. After cleaning either the edge on the front surface side and the end side or the rear surface side of the substrate, the other may be cleaned. Additionally, the treatment device may be changed depending on cleaning at the edge on the front surface side and the end side and cleaning on the rear surface side of the substrate, and any device may be used as long as the same effect as that described in conjunction with this embodiment can be obtained.

It is to be noted that, as the cleaning liquid supplied from the substrate edge cleaning treatment nozzle to the substrate, there are organic solvents, e.g., γ-butyrolactone, PGMEA (propylene glycol monomethylethylacetate), PGME (propylene glycol monomethylethyl), alcohol and others as well as cyclohexanone, for example. However, the organic solvents are not restricted thereto, and any organic solvents can be used as long as they can dissolve the chemically amplified resist film to be cleaned off and removed.

Although the present invention has been explained based on the foregoing embodiments, the present invention is not restricted these embodiments. Although the fine pattern forming material has been explained as the example in the foregoing embodiments, the present invention can be applied to, e.g., a resist chemical and others.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of substrate edge treatment comprising:
    forming a photo-resist film on a treatment target substrate;
    applying an exposure light to a predetermined position on the photo-resist film through a mask pattern to form a latent image on the photo-resist film using liquid immersion exposure;
    heating the treatment target substrate in which the latent image is formed on the photo-resist film;
    developing the photo-resist film after said heating;
    inspecting whether a residue is present at an edge of the treatment target substrate after said developing;
    cleaning an end of the treatment target substrate to remove the residue at the edge of the treatment target substrate determined to be defective in said inspecting by sucking/ holding a rear surface of the treatment target substrate to rotate the treatment target substrate, and supplying a cleaning liquid to the treatment target substrate at an edge of a front surface thereof and an edge of the rear surface thereof; and supplying pure water onto a main surface of the treatment target substrate after said supplying a cleaning liquid to the treatment target substrate, wherein said supplying a cleaning liquid to the treatment target substrate includes preparing a hollow annular member completely surrounding the entire edge of the treatment target substrate and supplying/holding the cleaning liquid into/in the hollow annular member, and discharging the cleaning liquid from a nozzle toward an inside of the hollow annular member.

2. The method according to claim 1, wherein the hollow annular member includes of a top plate and a bottom plate to form a ring-shaped concave portion so as to completely surround the entire edge of the substrate when the top plate and the bottom plate are brought into contact with each other.

* * * * *